United States Patent
Ross et al.

(10) Patent No.: US 10,680,644 B2
(45) Date of Patent: Jun. 9, 2020

(54) DECOMPRESSION OF MODEL PARAMETERS USING FUNCTIONS BASED UPON CUMULATIVE COUNT DISTRIBUTIONS

(71) Applicant: Groq, Inc., Menlo Park, CA (US)

(72) Inventors: Jonathan Alexander Ross, Palo Alto, CA (US); Dennis Charles Abts, Eau Claire, WI (US)

(73) Assignee: Groq, Inc., Mountain View, CA (US)

( * ) Notice: Subject to any disclaimer, the term of this patent is extended or adjusted under 35 U.S.C. 154(b) by 0 days.

(21) Appl. No.: 16/132,201

(22) Filed: Sep. 14, 2018

(65) Prior Publication Data
US 2019/0207626 A1 Jul. 4, 2019

Related U.S. Application Data

(60) Provisional application No. 62/559,413, filed on Sep. 15, 2017.

(51) Int. Cl.
*H03M 7/42* (2006.01)
*G06N 3/08* (2006.01)
(Continued)

(52) U.S. Cl.
CPC ............... *H03M 7/42* (2013.01); *G06N 3/08* (2013.01); *G06N 7/00* (2013.01); *H03M 7/3071* (2013.01);
(Continued)

(58) Field of Classification Search
CPC .... H03M 7/42; H03M 7/3071; H03M 7/6005; H03M 7/425; G06N 7/00
(Continued)

(56) References Cited

U.S. PATENT DOCUMENTS 8,244,911 B2* 8/2012 Bass ................. H04L 69/04
370/474
8,326,781 B2* 12/2012 Kugler ................. H04L 69/22
706/15

(Continued)

FOREIGN PATENT DOCUMENTS

TW   I279092 B   4/2007
TW   I591976 B   7/2017

OTHER PUBLICATIONS

Dr. Dobbs, "Arithmetic Coding and Statistical Modeling," Feb. 1, 1991, 28 pages, [Online] [Retrieved on Nov. 18, 2019] Retrieved from the Internet <URL: https://www.drdobbs.com/parallel/arithmetic-coding-and-statistical-modeli/184408491>.

(Continued)

Primary Examiner — Brian K Young
(74) Attorney, Agent, or Firm — Fenwick & West LLP

(57) ABSTRACT

A predictive model utilizes a set of coefficients for processing received input data. To reduce memory usage storing the coefficients, a compression circuit compresses the set of coefficients prior to storage by generating a cumulative count distribution of the coefficient values, and identifying a distribution function approximating the cumulative count distribution. Function parameters for the determined function are stored in a memory and used by a decompression circuit to apply the function the compressed coefficients to determine the decompressed component values. Storing the function parameters may consume less memory in comparison to storing a look-up table for decompression, and may reduce an amount of memory look-ups required during decompression.

22 Claims, 10 Drawing Sheets

(51) Int. Cl.
  *G06N 7/00* (2006.01)
  *H03M 7/30* (2006.01)
  *H03M 7/40* (2006.01)
(52) U.S. Cl.
  CPC ......... *H03M 7/425* (2013.01); *H03M 7/6005* (2013.01); *H03M 7/4006* (2013.01); *H03M 7/4037* (2013.01); *H03M 7/6023* (2013.01)
(58) Field of Classification Search
  USPC ............................................ 341/67, 87, 106
  See application file for complete search history.

(56) References Cited

U.S. PATENT DOCUMENTS

| | | | | |
|---|---|---|---|---|
| 8,824,569 B2* | 9/2014 | Agarwal | ................ | H03M 7/30 375/241 |
| 9,654,531 B2* | 5/2017 | Hoffert | .................. | H04L 65/60 |

OTHER PUBLICATIONS

PCT International Search Report and Written Opinion, PCT Application No. PCT/US2019/022355, dated Dec. 6, 2019, 17 pages.

Wikipedia, "Context-Adaptive Binary Arithmetic Coding," Nov. 14, 2018, four pages, [Online] [Retrieved on Nov. 18, 2019] Retrieved from the Internet <URL: https://en.wikipedia.org/w/index.php?title=Context-adaptive_binary_arithmetic_coding&oldid-868799469>.

Witten, I. H. et al., "Arithmetic Coding for Data Compression," Communications of the ACM, vol. 30, No. 6, Jun. 1987, pp. 520-540.

Taiwan Intellectual Property Office, Office Action, TW Patent Application No. 108109970, dated Mar. 2, 2020, six pages (with concise explanation of relevance).

\* cited by examiner

Decompression Functions
414

$F1(x) = ax^7 + bx^6 + cx^5 + dx^4 + ex^3 + fx^2 + gx^1 + h$
450a $F2(x) = ae^{-\frac{(x-b)^2}{2c^2}}$
450b $F3(x) = (e^{-\mu})(\mu^x)/x!$
450c

DECOMPRESSION OF MODEL PARAMETERS USING FUNCTIONS BASED UPON CUMULATIVE COUNT DISTRIBUTIONS

CROSS-REFERENCE TO RELATED APPLICATIONS

This application claims priority under 35 U.S.C. § 119(e) to U.S. Provisional Patent Application Ser. No. 62/559,413, titled "Decompression of Model Parameters Using Functions Based Upon Cumulative Count Distributions," filed on Sep. 15, 2017, which is hereby incorporated by reference in its entirety.

BACKGROUND

The present disclosure generally relates to a decompression of model parameters, and specifically relates to decompression of model parameters used for a neural network.

Neural networks and other types of models can be used to process various types of data. For example, a neural network model may be trained to recognize the presence or absence of certain types of objects within received input images. Training and machine learning can be used to determine a set of coefficients, such as weights between the neurons of a neural network model, to be used by the model for processing input data.

SUMMARY

A predictive model (e.g., a neural network model) may be used with a set of coefficients for the model. The set of coefficients can be stored in a memory and accessed for performing arithmetic operations on input data (e.g., an image to be analyzed by the model).

To reduce memory usage, the set of coefficients are compressed prior to storage. The stored compressed coefficients will need to be decompressed prior to operating on the input data. In some embodiments, determined coefficient values are compressed based upon a function. The function is generated based upon a cumulative count distribution of decompressed coefficient values. For example, the count values of a set of model coefficients may approximate a bimodal distribution, Gaussian distribution, Poisson distribution, or other type of distribution for which a function can be defined. Function parameters for the determined function may be stored in a memory and used by a decompression circuit to apply the function the compressed model coefficients for decompression. Storing the function parameters may consume less memory in comparison to other decompression methods (e.g., a look-up table), and may also reduce an amount of memory look-ups required during decompression.

In some embodiments, a method for decompressing model coefficient values is provided. The method comprises receiving compressed coefficient data associated with a model. In some embodiments, the values of the coefficient data are determined through a model training process, and wherein the coefficient data is compressed using a compression function based upon a cumulative distribution of values of the coefficient data. The method further comprises retrieving a set of function parameters associated with the compression function, the set of function parameters specifying at least a function type. The method further comprises configuring a decompression circuit based upon the retrieved function parameters. The method further comprises decompressing the compressed coefficient data at the decompression circuit based upon function parameters to produce decompressed coefficient values. The method further comprises applying the model to received input data by performing arithmetic operations upon the received input data based upon the compressed coefficient values.

BRIEF DESCRIPTION OF THE DRAWINGS

FIG. 4B illustrates an example decompression functions circuit containing function calculation circuits corresponding to different function types, in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

A predictive model (e.g., a neural network model) may utilize a set of coefficients when processing received input data. For example, for a neural network model, the set of coefficients may correspond to weights between different neurons of the neural network. The set of coefficients can be stored in a memory and accessed for performing arithmetic operations on input data (e.g., an image to be analyzed by the model).

To reduce memory usage, the set of coefficients are compressed prior to storage. The stored compressed coefficients will need to be decompressed prior to operating on the input data. Look-up tables may be used to map compressed coefficient values to decompressed coefficient values. However, the look-up tables may require a significant amount of memory for storage, especially if the range of coefficients is large. In addition, in some embodiments different types of compression may be performed on different subsets of coefficients, and as such would require storage of multiple look-up tables.

In some embodiments, determined coefficient values are compressed based upon a function. The function is generated based upon a cumulative count distribution of decompressed coefficient values. For example, the count values of a set of model coefficients may approximate a bimodal distribution, Gaussian distribution, Poisson distribution, or other type of distribution for which a function can be defined. Function parameters for the determined function may be stored in a memory and used by a decompression circuit to apply the function the compressed model coefficients for decompression. Storing the function parameters may consume less memory than storing a look-up table for decompression. In addition, the storage space required for storing the function parameters of a determined function are independent of the range of coefficient values or the number of different possible coefficient values.

The use of decompression functions also reduces the amount of memory look-ups required during decompression. For example, the function parameters of a given function only need to be looked up once at the start of decompression by the decompression circuit, and used to decompress a large number of coefficients compressed using the function. On the other hand, use of look-up tables for decompression typically requires a memory lookup for each coefficient to be decompressed.

Figure 1:
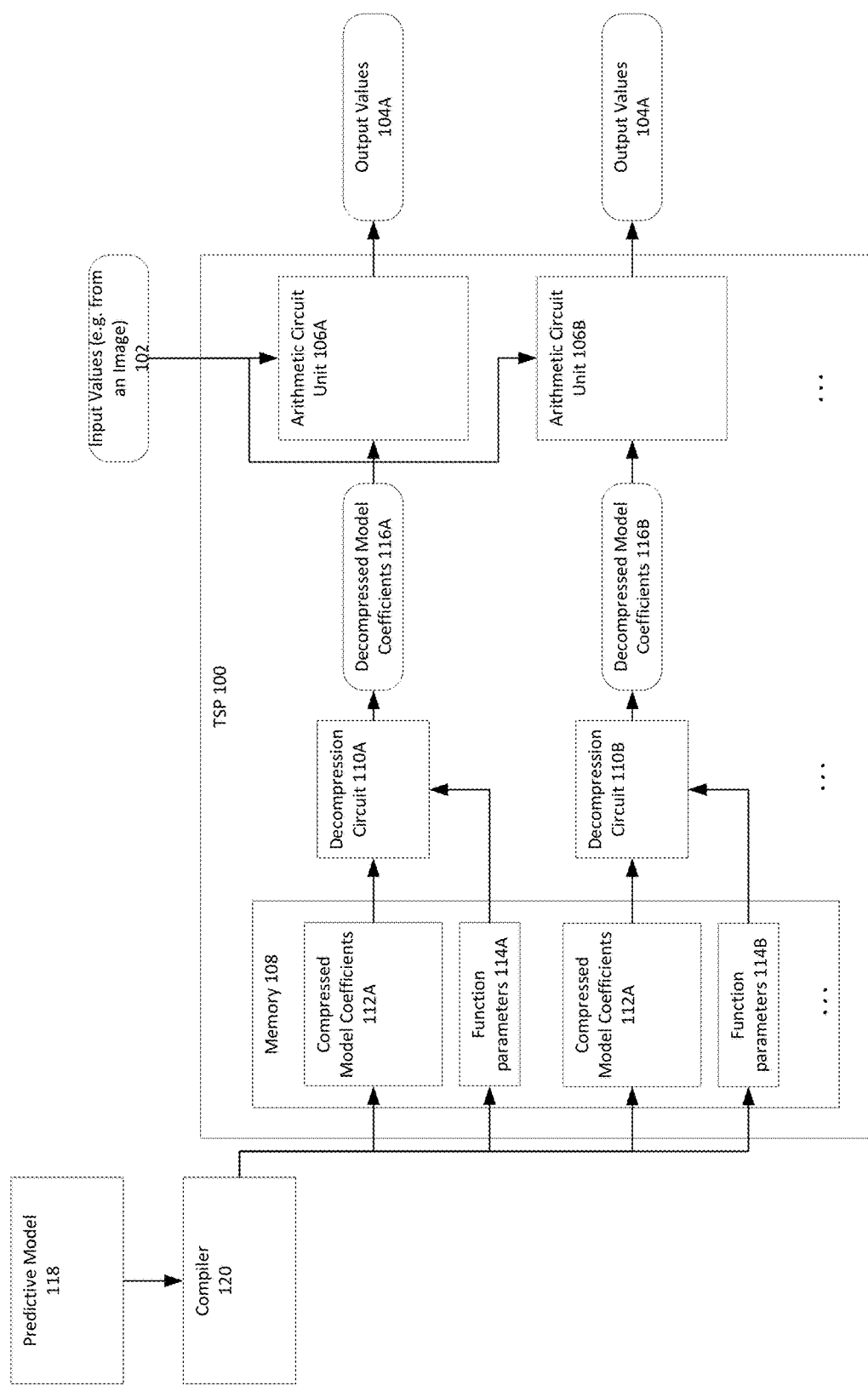
FIG. 1 illustrates a schematic diagram of a system for storing and decompressing model coefficients for use in a model, in accordance with some embodiments.

FIG. 1 illustrates a schematic diagram of a system for storing and decompressing model coefficients for use in a model, in accordance with some embodiments. A tensor stream processor (TSP) 100 or other type of processor is configured to receive and process input data values 102 (e.g., from an input image) based upon a stored model to produce output data values 104 (e.g., a classification of the input image, identification of certain types of objects or characteristics in the input data, and/or the like). The TSP 100 may be an integrated circuit (IC). In some embodiments, the input data values 102 can be input values stored in the memory 108 and which represent the result of arithmetic operations performed elsewhere within the TSP 100.

The TSP 100 operates on the input data values 102 using one or more arithmetic circuit units 106 and one or more model coefficients. The arithmetic circuit units 106 include logic circuits that perform arithmetic operations on the input values 102 and model coefficients, and generate output values 104 representing a result of the arithmetic operations. For example, the arithmetic circuit units 106 may perform a matrix multiplication operation on the input values using the model coefficients, and generates output values 104 representing the matrix product. The execution of a predictive model 118, such as a neural network, can often be implemented with several successive stages of matrix multiplications. In other embodiments, the arithmetic operation of the arithmetic circuit units 106 can include a convolution operation, a dot product operation, a fast Fourier transform (FFT) operation, and/or other arithmetic operations. The arithmetic circuit units 106 may execute operations with single instruction multiple data (SIMD) processing.

The TSP 100 comprises a memory 108 that stores compressed model coefficients 112 used by the arithmetic units 106 to operate on the input data values 102. The compressed model coefficients 112 may be generated by the compiler 120 from the predictive model 118. The predictive model 118 may correspond to any type of model that utilizes a set of coefficients. In some embodiments, the set of coefficients is determined through a machine learning or training process. For example, in some embodiments, the predictive model 118 is a convolution neural network (CNN) or other type of neural network model.

Once the predictive model 118 has been constructed or sufficiently trained, the model 118 may be compiled by a compiler 120 for use by the TSP 100 for processing input data values 102. The compiler 120 analyzes the coefficient values of the predictive model 118, and selects one or more compression schemes for compressing the coefficient values of the model. The compressed coefficient values are then stored as the compressed model coefficients 112 in the memory 108.

In order to be utilized by the arithmetic circuit units 106 for operating on input data values 102, the compressed model coefficients 112 associated with the model need to decompressed. A decompression circuit 110 is configured to receive the compressed model coefficients 112 from the memory 108, and outputs decompressed model coefficients 116 that may be operated on by the arithmetic units 106.

In some embodiments, the compiler 120 selects a compression scheme for the coefficients of the predictive model 118 based upon a function derived from a distribution of coefficient values associated with the model. For example, in many cases, the distribution of coefficient values of the model may have a distribution that is a bimodal distribution, a Gaussian distribution, or a Poisson distribution. The compiler 120 determines a type of function that best fits the distribution of model coefficients, and stores the parameters of the determined function in the memory 108 as the function parameters 114. The function parameters 114 may indicate a type of function associated with the distribution, as well as values for coefficients of the function and/or other parameters relating to the function. In some embodiments, the types of function parameters stored are based upon a type of function.

The decompression circuit 110 supports several possible functions for decompressing the compressed model coefficients 112. The decompression circuit 110 decompresses the compressed model coefficients 112 by applying the specific function defined by the function parameters 114 on the compressed model coefficients 112 to determine the decompressed model coefficients 116.

The use of functions for performing decompression may reduce the amount of memory needed to store data used for decompression (e.g., in comparison to a look-up table). In addition, the amount of memory needed to store the function parameters may be independent on the range of coefficient values or the number of different possible coefficient values. The use of decompression functions also reduce the amount of memory look-ups required during decompression. For example, the function parameters 114 may represent a small constant amount of memory that is looked up once at the start of decompression, and can be used to decompress a long string of data comprising many coefficients. On the other hand, use of look-up tables for decompression typically requires a memory lookup for each coefficient to be decompressed.

In some embodiments, the memory 108 may store the compressed model coefficients of the predictive model 118 as a plurality of different coefficient sets (e.g., a first set of compressed model coefficients 112A and a second set of compressed model coefficients 112B). Each set of compressed model coefficients 112 may have been compressed based upon a different function (e.g., a first function associated with first function parameters 114A and a second function associated with second function parameters 114B) and with arithmetic or Huffman coding. In some embodiments, a different decompression circuit (e.g., decompression circuits 110A and 110B) may be used to decompress the different sets of compressed model coefficients compressed using different functions, to produce different sets of decompressed model coefficients (e.g., decompressed model coefficients 116A and 116B). The output decompressed model parameters 116A and 116B may be operated on by multiple arithmetic units (e.g., arithmetic units 106A and 106B).

In some embodiments, multiple functions may be used to decompress the compressed model coefficients. For example, the compiler, when compressing the model coefficients, may divide the coefficients into one or more subsets, and determine a function and parameters corresponding to the distribution of coefficient values in each subset.

Figure 2:
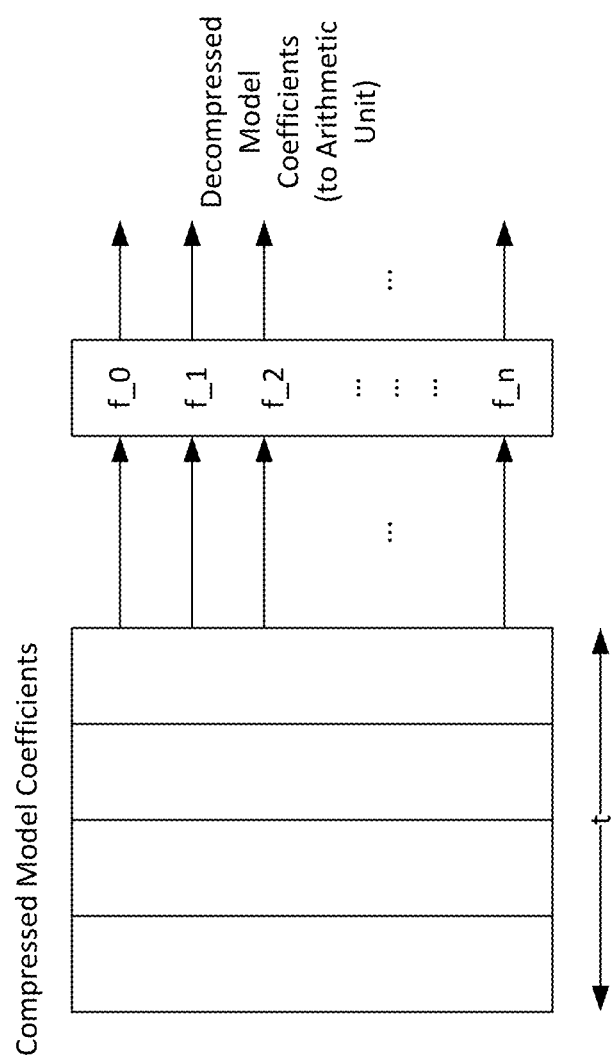
FIG. 2 illustrates a block diagram of a set of compressed model coefficients that may be decompressed using different functions, in accordance with some embodiments.

FIG. 2 illustrates a block diagram of a set of compressed model coefficients that may be decompressed using different functions. In some embodiments, the compressed model coefficients may be transmitted from the memory to a decompression circuit over a plurality of bit channels (e.g., bit channels 0 to n). The decompression circuit may decompress the incoming coefficient data over each bit channel using a different function (e.g., functions f_0 through f_n). For example, the decompression circuit may receive multiple sets of function parameters corresponding to the functions f_0 through f_n, each function used to decompress received coefficient data over a corresponding bit channel.

Although FIG. 2 illustrates the decompression circuit applying a different function for each bit channel, it is understood that in other embodiments, a common function may be applied to multiple bit channels. In addition, the functions used by the decompression circuit for decompressing the compressed model coefficients may be configured to change over time. For example, at a time t=0, the decompression circuit may use the functions f_0 through f_n for decompression. However, at a later time t=$t_1$, the decompression circuit may receive different sets function parameters for changing the functions used for decompressing one or more of the bit channels. In some embodiments, the compiler, when compressing the model coefficients to be stored in the memory of the TSP, determines which functions are used for compression/decompression of the model coefficients for which bit channels and at which times.

In some embodiments, certain coefficient values may, when compressed using certain compression schemes, take up a larger number of bits when compressed as compared to being decompressed. As such, the compiler may determine that such coefficient values may not need to be compressed. During decompression, the decompression circuit may be configured apply an identity function on these coefficient values. Alternatively, the decompression circuit may be bypassed.

Figure 3A:
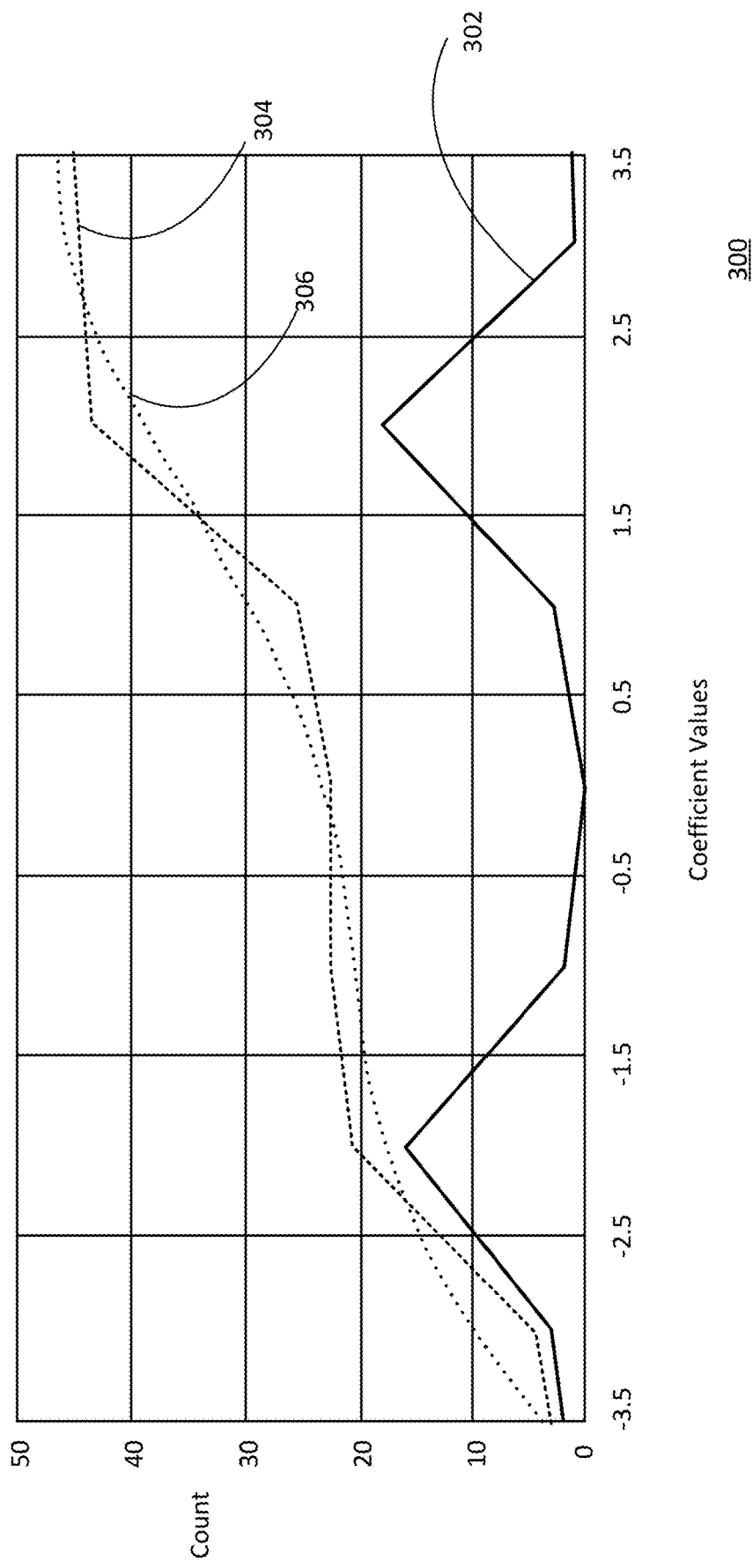
FIGS. 3A and 3B illustrate example graphs showing a distribution of model coefficients, in accordance with some embodiments.

FIG. 3A illustrates an example graph showing a distribution of model coefficients, in accordance with some embodiments. The graph 300 has an x-axis corresponding to coefficient values, and a y-axis corresponding to count values. While the x-axis of the graph 300 only shows integer coefficient values, it is understood that the coefficient values of a model may be represented using integers, floating point numbers, fixed point numbers, and/or the like.

The graph 300 contains a first plot 302 showing a distribution of coefficient values for a particular model. Upon the generation of a set of coefficients for the model (e.g., through a training process), the number of coefficients of the set having each value is counted. In many cases, the number of coefficients of each value will approximate a common distribution, such as a bimodal distribution, a Gaussian distribution, a Poisson distribution, and/or the like. For example, as illustrated by the first plot 302, the coefficient values of the particular model has a substantially bimodal distribution, with the greatest number of coefficients having values of −2 or 2.

The graph 300 also illustrates a second plot 304 indicating a cumulative distribution of the coefficient values for the model. The cumulative distribution plot 304 indicates, for each coefficient value represented on the x-axis of the graph 300, a total number of coefficients less than or equal to that value. As such, the cumulative distribution for a set of coefficients will be monotonically increasing, allowing for a function of the distribution to be used to derive a unique coefficient value from a given count value.

The coefficient values of the model are compressed by the compiler based upon a function fitting the cumulative count distribution of the coefficients. In some embodiments, the compiler may first select a function type based upon the cumulative count distribution, and determine function parameters for the selected function type to achieve a best fit for the function type against the cumulative count distribution. For example, the third plot 306 illustrated in the graph 300 corresponds to a polynomial function that may be selected by the compiler to approximate the cumulative count distribution 304. As illustrated in FIG. 3, the polynomial function corresponding to the third plot 306 may be an eighth order polynomial function. In some embodiments, the function may be based upon an integral of a function approximating the count distribution of the coefficient values (plot 302).

Figure 3B:
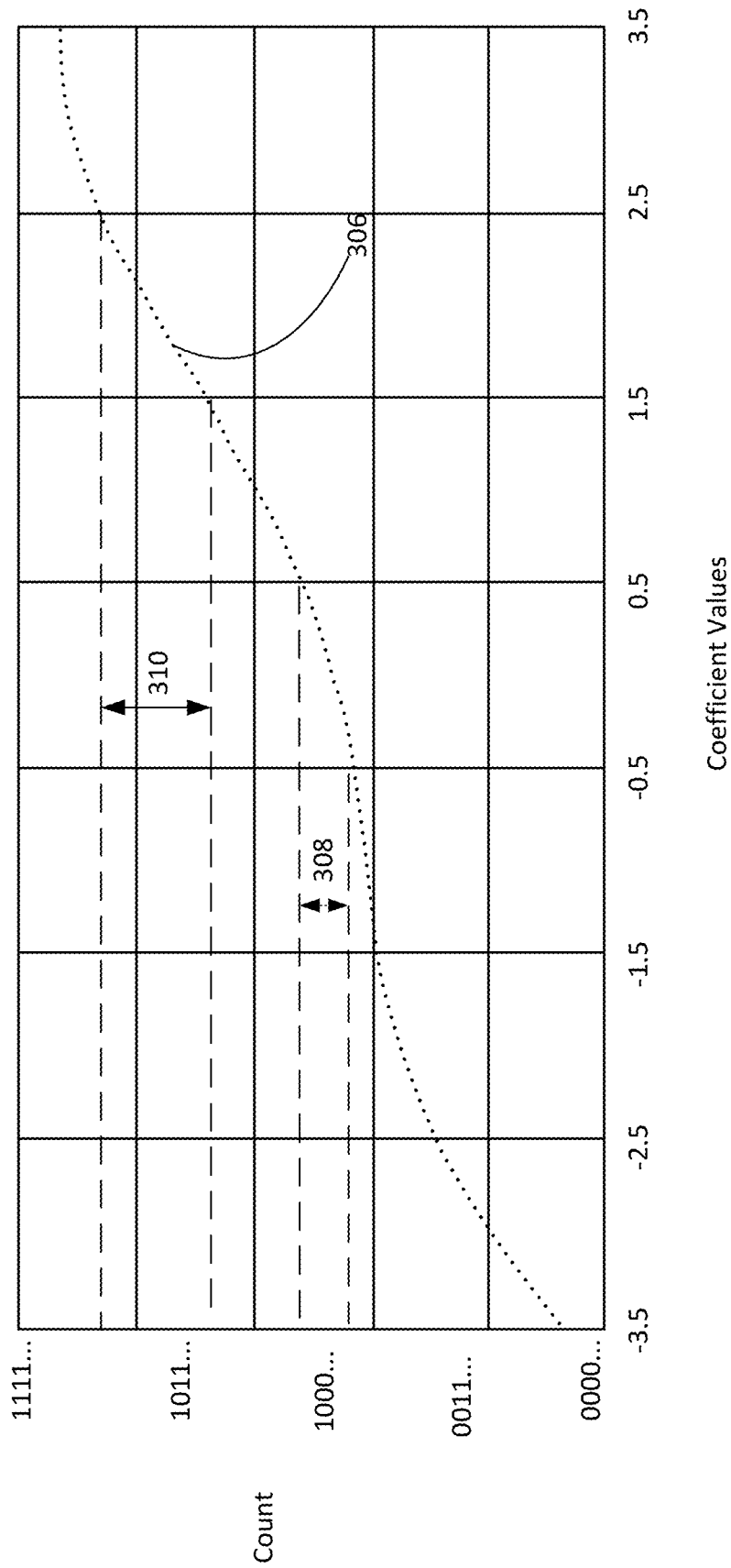

In some embodiments, the compiler compresses the coefficient values based upon the determined function using arithmetic encoding. For example, as illustrated in FIG. 3B, the count values of the function are fitted into a range between 0 and 1, wherein 0 is represented by the binary sequence 0000 . . . and 1 is represented by binary sequence 1111 . . . . This results in more popular coefficients (e.g., coefficients with higher count values) being represented with short bit sequences, and less popular coefficients being represented with long bit sequences.

In some embodiments, each coefficient value may correspond to a value interval, based upon the intervals between adjacent coefficient values. The interval for each coefficient value may be determined based upon a rounding scheme, ceiling function, floor function, and/or the like. For example, in an embodiment where the coefficient values are integers and a floor function is used for determining value intervals, the coefficient value of 1 may correspond to the interval [1, 2), the coefficient value of 2 may correspond to the interval [2, 3), etc.

Each interval may correspond to a range of binary sequence values (as determined using the function), wherein each coefficient value is coded using a sequence of bits representative of the range of binary sequence values corresponding to the interval. As such, because coefficient values with high counts will generally correspond to a larger range of binary sequence values, they may be compressed using a smaller number of bits.

For example, suppose that the coefficient values are integers, and that the coefficient value 0 corresponds to the interval [−0.5, 0.5), while the coefficient value 2 corresponds to the interval [1.5, 2.5). As illustrated in FIG. 3B, based upon the function 306, bit sequences within the range 308 would map to the coefficient value 0, while bit sequences within the range 310 would map to the coefficient value 2. Because the range 310 spans a larger range of bit sequences, the range of bit sequences can typically be represented using a smaller number of common bits compared to those of the range 308. As such, the coefficient value 2 (which has a higher count compared to the coefficient value 0, as illustrated in FIG. 3A) when compressed is represented using a smaller number of bits compared to the coefficient value 0. For example, the range 308 spans the sequences 1000 . . . , while the range 310 may span the binary sequences of 1011 . . . through 1110 . . . . As such, the coefficient value 0 may be represented using the bit sequence 1000 (4 bits), while the coefficient value 2 may be represented using the bit sequence 110 (3 bits). It is understood that the bit sequence representing a compressed coefficient value may in some embodiments not represent all bit sequences within the range corresponding to the interval associated with the value, as long as the bit sequence does not represent bit sequences of ranges corresponding to the interval of other coefficient values.

Figure 4A:
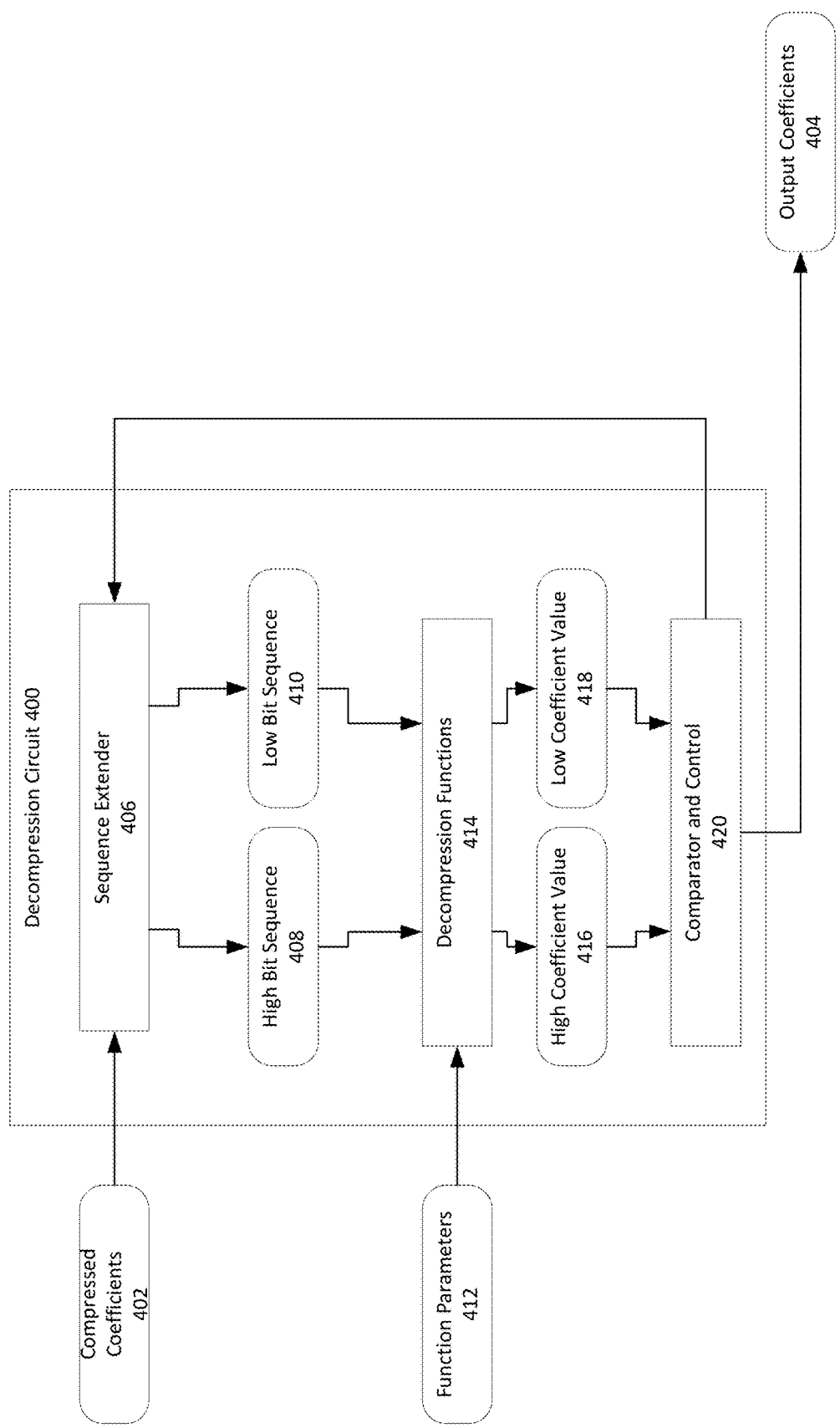
FIG. 4A illustrates a block diagram of a decompression circuit, in accordance with some embodiments.

FIG. 4A illustrates a block diagram of a decompression circuit, in accordance with some embodiments. The decompression circuit 400 may correspond to the decompression circuits 110 illustrated in FIG. 1, and is configured to receive compressed coefficient values 402 and output decompressed coefficient values 404. In some embodiments, the decompression circuit decompresses the bits received from the compressed coefficient values 402 using arithmetic coding techniques and a function associated with the coefficient values 402.

The decompression circuit receives a sequence of one or more bits of the compressed coefficient values 402 at a sequence extender circuit 406, which generates a high bit sequence 408 and a low bit sequence 410 for the received bit sequence. As used herein, the high bit sequence 408 corresponds to the received bit sequence appended with a plurality of binary "1" values, and the low bit sequence 410 corresponds to the received bit sequence appended with a plurality of binary "0" values. For example, for the received sequence of bits "10", the high bit sequence is "10111 . . . " while the low bit sequence would be "10000 . . . ."

The decompression functions circuit 414 determines a function to be used for decompression based upon one or more received function parameters 412. For example, FIG. 4B illustrates an example decompression functions circuit containing function calculation circuits corresponding to different function types, in accordance with some embodiments. The decompression functions circuit 414 includes several function calculation circuits 450, each of which implements a different type of function for calculating an output value from an input value. For example, as illustrated in FIG. 4B, the function calculation circuits 450 may comprise a first function calculation circuit 450a corresponding to a polynomial function, a second function calculation circuit 450b corresponding to a Gaussian distribution function, and a third function calculation circuit 450a corresponding to a Poisson distribution function, respectively.

The function parameters 412 may comprise a first function type parameter indicating a type of function (e.g., polynomial function, Gaussian distribution function, and/or the like) usable by the decompression functions circuit 414 to determine a function calculation circuit 450 to be used, and zero or more additional function coefficient parameters (e.g., coefficients for a polynomial function). As illustrated in FIG. 4B, each different type of function may be associated with a different number of coefficients and/or different types of coefficients. For example, the function calculation circuit 450b may be configured to calculate a function for decompressing coefficient values that fit a Gaussian type distribution (e.g., an inverse of an integral of a Gaussian distribution), while the function calculation circuit 450c may be configured to calculate a function for decompressing a Poisson type distribution. In some embodiments, the decompression functions circuit 414 may receive different sets of function parameters 412 based upon the set or subset of compressed coefficients to be decompressed. The decompression functions circuit 414 applies the function on the high bit sequence 408 to determine a high coefficient value 416, and on the low bit sequence 410 to determine a low coefficient value 418.

In some embodiments, the decompression functions circuit 414, when processing a received bit sequence (e.g., the high or low bit sequence), determines a corresponding value using the function, and identifies a coefficient value corresponding to the bit sequence based upon an interval that the corresponding value falls within. For example, if the corresponding value determined by the function corresponds to a value between two different coefficient values, the decompression functions circuit 414 may select a coefficient value based upon an interval selection scheme (e.g., rounding, ceiling function, floor function, and/or the like).

The comparator and control circuit 420 receives the high coefficient value 416 and the low coefficient value 418 determined by the decompression functions circuit 414, and determines whether the high and low coefficient values are the same. If the high and low coefficient values are the same, then the received bit sequence is output as a decompressed output coefficient 404. The decompression circuit 400 may then begin receiving a new bit sequence from the compressed coefficient values 402.

On the other hand, if the high coefficient value 416 and the coefficient value 418 are not identical, then a decompressed output coefficient cannot be determined using the currently received bit sequence. The decompression circuit receives an additional bit from the compressed coefficient values 402, and updates the high and low bit sequences 408 and 410. In some embodiments, because either the high bit sequence 408 or the low bit sequence 410 will remain the same when an additional bit is received, for each subsequently received bit, only a single additional extended bit sequence needs to be re-calculated (e.g., the low bit sequence 410 if the received bit is a "1," or the high bit sequence 408 if the received bit is a "0"). Similarly, the decompression function circuit 414 only needs to determine a coefficient value for the recalculated extended bit sequence, instead of needing to recalculate both high and low coefficient values for high and low extended bit sequences. The updated coefficient values are then compared by the comparator 420 to determine if a decompressed coefficient value can be output, or if additional bits are needed.

Table 1 illustrates a simplified example of compressed bit sequences mapped to decompressed coefficient values. For example, the decompression function circuit 414 may apply a function (as defined by received function parameters 412) to a received bit sequence (e.g., 0011 . . . ), wherein the resulting value falls within the interval for a coefficient value (e.g., −2). As such, the decompression function circuit 414 would return the coefficient value "−2" in response to the received bit sequence "0011."

TABLE 1

| Compressed Bit Sequence | Decompressed Coefficient Value |
|---|---|
| 0000 . . . | −3 |
| 0001 . . . | −3 |
| 0010 . . . | −2 |
| 0011 . . . | −2 |
| 0100 . . . | −2 |
| 0101 . . . | −2 |
| 0110 . . . | −1 |
| 0111 | −1 |
| 1000 | 0 |
| 1001 | 1 |
| 1010 | 1 |
| 1011 | 2 |

TABLE 1-continued

| Compressed Bit Sequence | Decompressed Coefficient Value |
| --- | --- |
| 1100 | 2 |
| 1101 | 2 |
| 1110 | 2 |
| 1111 | 3 |

As an illustrative example, suppose that the decompression circuit receives the bit sequence "0100111000000110." The decompression circuit 400 receives the first bit of the stream ("0"), whereupon the sequence extender circuit 406 determines a high extended bit sequence "0111 . . . " and a low extended bit sequence "0000 . . . ." The decompression function circuit 414 receives the high and low extended bit sequences, and determines the high and low coefficient values, which correspond to "−1" and "−3," respectively. Because the high and low coefficient values do not match, the comparator and control circuit 420 cannot determine a single output coefficient value to be output. As such, the decompression circuit 400 receives a subsequent bit from the bitstream.

When the next bit of the bitstream is received, the current bit sequence at the decompression circuit 400 is "01." Because the high extended bit sequence is still "0111 . . . ," the sequence extender circuit 406 only needs to recalculate a low extended bit sequence for the current bit sequence ("0100 . . . "). The decompression function circuit 414 also calculates an updated low coefficient for the low extended bit sequence ("−2"). Because the high and low coefficient values still do not match, the decompression circuit 400 receives another bit from the bitstream without outputting a decompressed coefficient value.

The current bit sequence upon receipt of the next bitstream bit is "010." The sequence extender circuit 406 determines an updated high extended bit sequence "0101 . . . ," which the decompression function circuit 414 determines to correspond to a coefficient value of "−2." Because both high and low coefficient values match, the decompression circuit 400 outputs "−2" as a decompressed coefficient value 404. The decompression circuit may continue to receive bits of the compressed bit sequence "0100111000000110" and output corresponding coefficient values (e.g., "−1" for the bit sequence "011", "0" for the bit sequence "1000", "−3" for the bit sequence "000", and "2" for the bit sequence "110").

While the above examples primarily discuss compressing and decompressing model coefficient values using arithmetic coding and decompression functions, it is understood that in other embodiments, different types of coding may be used. For example, in some embodiments, the model coefficient values may be compressed and decompressed using Huffman coding in combination with functions.

In some embodiments, the set of coefficients for a model may be split into a plurality of subsets, wherein the coefficient counts for each subset may conform to a different distribution. As such, each subset of coefficients may be compressed and decompressed based upon a different function (e.g., as illustrated in FIG. 2). For example, different functions can be applied to compressed coefficient values stored in the memory of the TSP, based upon the bit channel and position of the compressed coefficient.

Interleaved Input

In some embodiments, a plurality of decompression circuits can be used to decompress a bitstream containing compressed coefficient data in parallel. For example, during a first clock cycle, each decompression circuit may process a first bit of a different compressed coefficient. When a particular decompression circuit finishes decompressing a particular coefficient, it may move on to a subsequent compressed coefficient that is currently not being processed.

For example, a bitstream of compressed coefficient data may comprise x bits corresponding to a first coefficient, and y bits corresponding to a second coefficient. During a first clock cycle, a first decompression circuit may process the first bit of the first coefficient, while a second decompression circuit may process the first bit of the second coefficient. If x<y, at an x+1'th clock cycle, the first decompression circuit has finished processing the first coefficient, and may begin processing a first bit of a third coefficient, while the second decompression circuit may, at an y+1'th clock cycle, process a first bit of a fourth coefficient.

Figure 5:
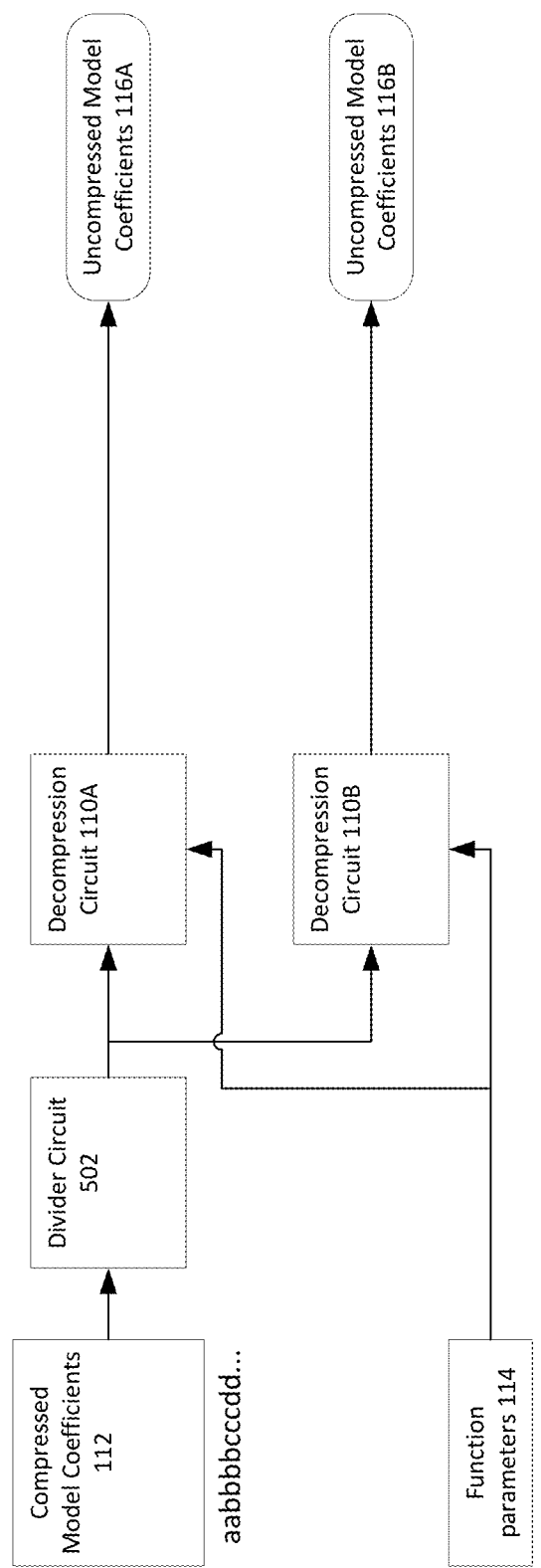
FIG. 5 illustrates a diagram of a plurality of decompression circuits used to decompress compressed coefficient data in parallel, in accordance with some embodiments.

For example, FIG. 5 illustrates a diagram of a plurality of decompression circuits used to decompress compressed coefficient data in parallel, in accordance with some embodiments. The compressed model coefficients 112 may generate a bitstream represented as "aabbbbcccdd . . . ," which comprises 2 bits used to code a first coefficient "a", 4 bits used to code a second coefficient "b", 3 bits used to code a third coefficient "c", and 2 bits used to encode a fourth coefficient "d." A divider circuit 502 divides the stream of bits between a first decompression circuit 110A and a second decompression circuit 110B. The divider 502 determines a position in the bitstream where the encoding for each coefficient begins, and divides the bits of the bitstream between the decompression circuits 110A and 110B, such that each decompression circuit decompresses bits of a different coefficient. For example, at a first clock cycle, the divider circuit 502 is configured to transmit a first bit of the coefficient "a" to the decompression circuit 110A, and a first bit of the coefficient "b" to decompression circuit 110B. Each of the decompression circuits 110A and 110B processes the received bits using a function based upon stored function parameters 114. During a third clock cycle, the decompression circuit 110A has finished processing the bits for the coefficient "a," and receives a first bit of the next unprocessed coefficient (e.g., coefficient "c"), while the decompression circuit 110B receives and processes the third bit of the coefficient "b."

The decompression circuits 110A and 110B output decompressed model coefficients 116A and 116B, respectively, in some embodiments, an interleaver circuit (not shown) may be used that interleaves the decompressed coefficients 116A and 116B to form a decompressed coefficient bitstream.

Because the compiler performs the initial compression of the model coefficients, and as such is aware of the bit length corresponding to each compressed coefficient value, the compiler may store instructions to the memory specifying which portions of a bitstream are operated upon by which decompression circuits, such that each decompression circuit is able to receive a first bit of a subsequent compressed coefficient following the decompression of a previous coefficient.

Process Flow

Figure 6:
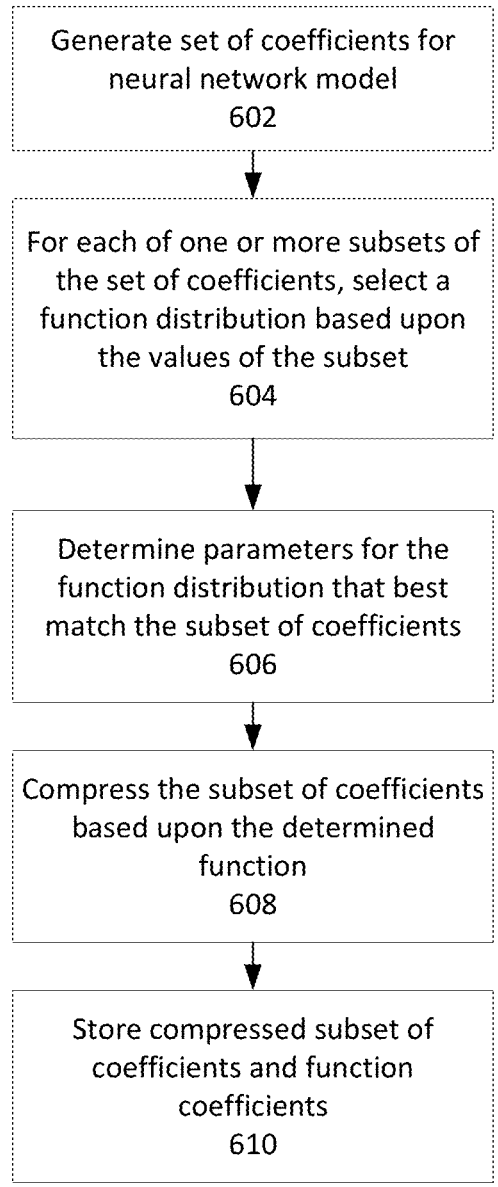
FIG. 6 is a flowchart of a process for generating a set of compressed model coefficients, in accordance with some embodiments.

FIG. 6 is a flowchart of a process for generating a set of compressed model coefficients, in accordance with some embodiments. A predictive model is constructed 602 and/or trained using a machine learning process, which generates a set of coefficients for the model. In some embodiments, the model may be a neural network model.

A compiler, for each of one or more subsets of the set of coefficients, selects 604 a function based upon the distribution of the coefficient values within the subset. For example, the compiler generate a cumulative count distribution of the coefficient values of the subset, and identify a function type that best fits the generated distribution. The function type may be based upon a polynomial function, a Gaussian distribution function, a Poisson distribution function, and/or the like. The compiler determines 606 parameters for the selected function type, in order to determine a function that best fits the distribution of coefficient values (e.g., cumulative count distribution) of the subset. The compiler compresses 608 the subset of coefficients based upon the determined function type and function parameters.

The compressed subset of coefficients and determined function parameters are stored 610 in a memory. The compressed coefficients may be used (after decompressing) by one or more arithmetic units for performing operations on input data (e.g., image data) in accordance with the predictive model.

Figure 7:
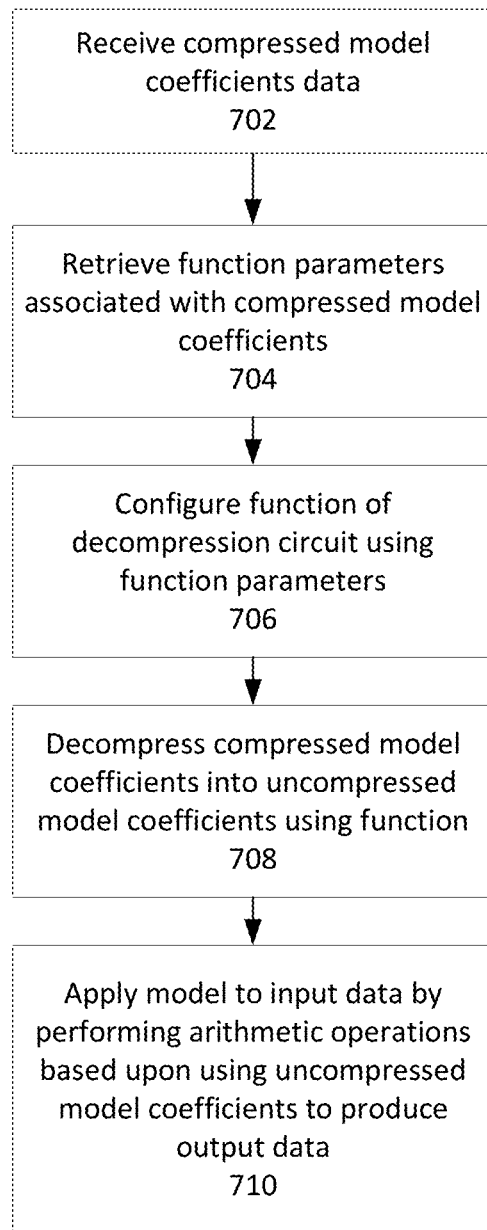
FIG. 7 is a flowchart of a process for decompressing compressed model coefficients, in accordance with some embodiments.

FIG. 7 is a flowchart of a process for decompressing compressed model coefficients, in accordance with some embodiments. The decompression circuit receives 702 data corresponding to compressed coefficients. In some embodiments, the input data is received as a bitstream, wherein each compressed coefficient is represented by a variable length bit sequence.

The decompression circuit receives 704 one or more function parameters corresponding to a function to be used for decompressing the received compressed coefficient data. The function parameters may indicate a type of function, as well as one or more coefficients for the function (e.g., where the type of function is a polynomial, the function parameters may indicate coefficients for the polynomial function). The decompression circuit configures 706 the function to be used by a decompression function circuit based upon the received function parameters. For example, in some embodiments, the decompression circuit comprises a plurality of decompression function circuits, each corresponding to a different type of function. In response to receiving the function parameters, the decompression circuit selects a particular decompression function circuit corresponding to a function type indicated by the received parameters, and configures the selected decompression function circuit based upon one or more additional function parameters (e.g., corresponding to function coefficient values).

The decompression circuit decompresses 708 the input data corresponding to compressed coefficients using the decompression function circuit to output decompressed coefficients, based upon the configured function. The decompressed coefficients may be provided to a TSP.

The TSP applies 710 the model to received input data by performing arithmetic operations on the input data using the decompressed coefficients received from the decompression circuit. The arithmetic operations may include matrix multiplication, dot product operations, FFT, and/or the like.

Figure 8:
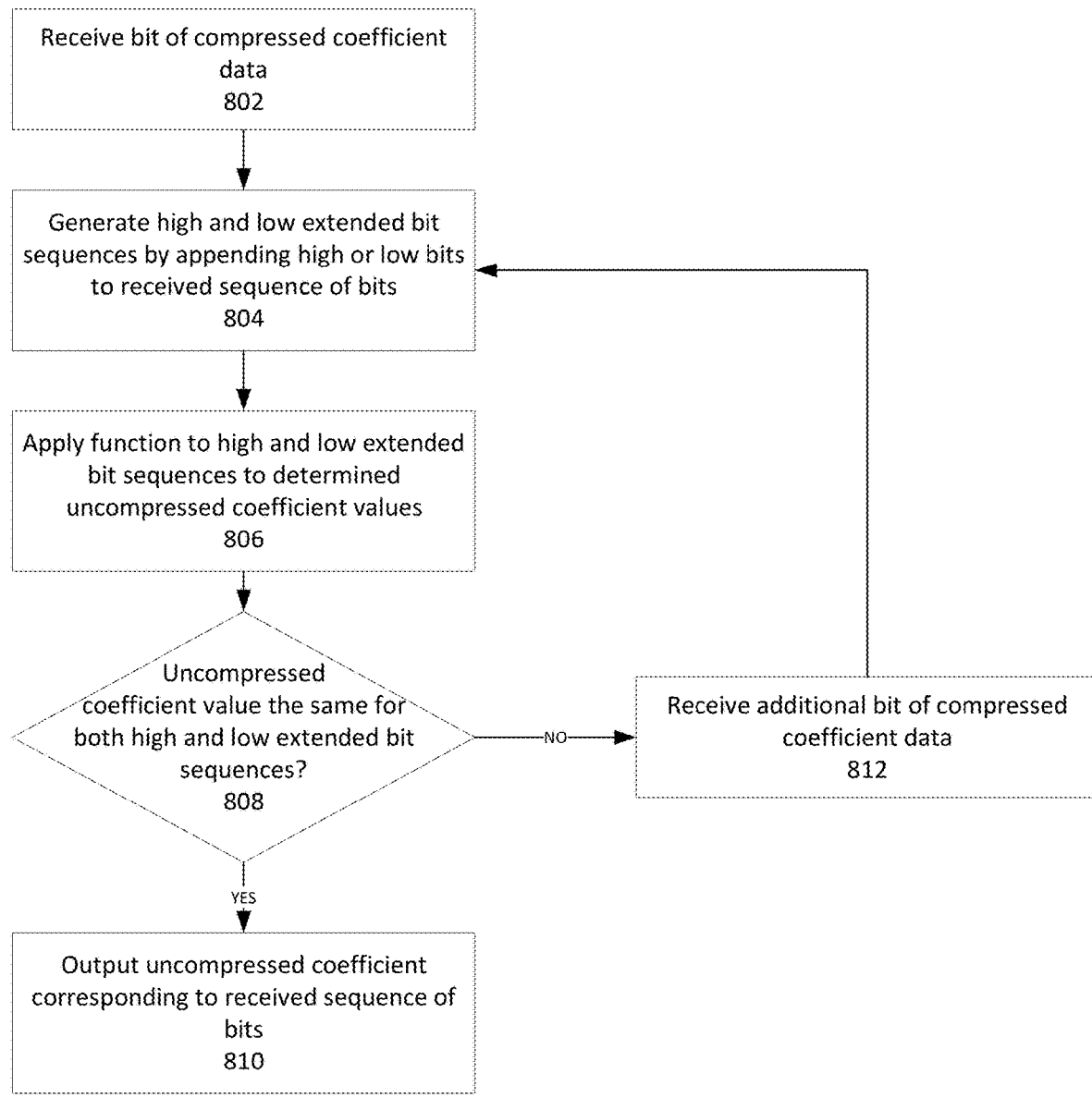
FIG. 8 is a flowchart of a process for performing decompression on compressed model coefficients using arithmetic decoding.

FIG. 8 is a flowchart of a process for performing decompression on compressed model coefficients using arithmetic decoding. The decompression circuit may receive the compressed coefficients as a bitstream. Because each coefficient value may be represented using a variable length bit sequence, the decompression circuit may evaluate each bit of the bitstream and determine whether a decompressed coefficient value can be obtained from the currently received bits.

The decompression circuit receives 802 a bit of compressed coefficient data. The decompression circuit generates 804 high and low extended bit sequences using the currently received bit sequence of compressed coefficient data by appending a sequence of high or low bits to the received sequence. The received bit sequence may correspond to a sequence of bits received by the decompression circuit that do not correspond to a decompressed coefficient value that has been output by the decompression circuit.

The decompression circuit applies 806 a determined function to the high and low extended bit sequences to determine decompressed coefficient values. The determined function may correspond to a plurality of received function parameters corresponding to the compressed coefficient values. In some embodiments, applying the function to the high or low extended bit sequence produces a value between two different possible coefficient values, and associated with a particular coefficient value based upon an interval scheme.

The decompression circuit determines 808 either the decompressed coefficient values for the high and low bit sequences are the same. If so, the current bit sequence is sufficient to determine a decompressed coefficient value, and the decompression circuit 810 outputs the decompressed coefficient value corresponding to the currently received bit sequence. The decompression circuit may then receive additional bits of compressed coefficient data as part of a new bit sequence to determine subsequent decompressed coefficient values.

On the other hand, if the decompressed coefficient values for the high and low bit sequences are different, then the current bit sequence is not sufficient for producing a decompressed coefficient value, and the decompression circuit receives 812 additional bits of compressed coefficient data, until the decompressed coefficient values corresponding to the high and low extended bit sequences match.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method, comprising:
receiving compressed coefficient data associated with a model, wherein the coefficient data is compressed using a compression function based upon a cumulative distribution of values of the coefficient data;
retrieving a set of function parameters associated with the compression function, the set of function parameters specifying at least a function type;
configuring a decompression circuit based upon the retrieved set of function parameters;
decompressing the compressed coefficient data using the decompression circuit based upon the set of function parameters to produce decompressed coefficient values; and
applying the model to received input data by performing arithmetic operations upon the received input data using the decompressed coefficient values to generate a set of output values.

2. The method of claim 1, wherein the values of the coefficient data are determined through a model training process.

3. The method of claim 1, wherein the function type is selected from at least one of a polynomial function, a bimodal distribution function, a Gaussian distribution function, or a Poisson distribution function.

4. The method of claim 1, wherein the coefficient data was compressed using arithmetic coding.

5. The method of claim 1, wherein the coefficient data was compressed using Huffman coding.

6. The method of claim 1, wherein decompressing the compressed coefficient data comprises applying the set of function parameters to at least a portion of the compressed coefficient data corresponding to a first compressed coefficient to determine a first decompressed coefficient value.

7. The method of claim 6, wherein applying the set of function parameters to at least a portion of the compressed coefficient data corresponding to a first compressed coefficient to determine a first decompressed coefficient value comprises:
receiving a sequence of one or more bits of the first compressed coefficient;
generating first and second extended bit sequences based upon the received sequence of bits;
applying the set of function parameters to the first and second extended bit sequences to determine first and second respective coefficient values; and
in response to a determination that the first and second coefficient values are the same, outputting the first coefficient value as the first decompressed coefficient value.

8. The method of claim 1, wherein:
the coefficient data comprises a first subset of coefficients compressed using the compression function, and a second subset of coefficients compressed using a second compression function, and
the set of function parameters comprises a first set of function parameters corresponding to the compression function, and a second set of function parameters corresponding to the second compression function, and
wherein retrieving the set of function parameters comprises retrieving the first set of function parameters or the second set of function parameters based upon a subset of coefficients to be decompressed.

9. The method of claim 1, wherein configuring the decompression circuit based upon the retrieved set of function parameters comprises selecting a decompression function circuit based upon the function type specified by the set of function parameters.

10. A processor, comprising:
a memory to store compressed coefficients associated with a predictive model, the compressed coefficients comprising first compressed coefficients and second compressed coefficients;
a first decompression circuit to decompress the first compressed coefficients into first decompressed coefficients using a first decompression function;
a first arithmetic circuit unit to receive first input data and the first decompressed coefficients, and to execute a first arithmetic operation based on first input data and the first decompressed coefficients to generate first output values;
a second decompression circuit to decompress the second compressed coefficients into second decompressed coefficients using a second decompression function; and
a second arithmetic circuit unit to receive second input data and the second decompressed coefficients, and to execute a second arithmetic operation based on second input data and the second decompressed coefficients to generate second output values.

11. A processor, comprising:
a memory storing compressed coefficient data associated with a model, wherein the coefficient data is compressed using a compression function based upon a cumulative distribution of values of the coefficient data;
a decompression circuit configured to:
receive a set of function parameters associated with the compression function, the set of function parameters specifying at least a function type, wherein the decompression circuit is configured based upon the retrieved set of function parameters;
decompress the compressed coefficient data based upon the set of function parameters to produce decompressed coefficient values; and
an arithmetic circuit unit configured to apply the model to received input data by performing arithmetic operations upon the received input data using the decompressed coefficient values to generate a set of output values.

12. The processor of claim 11, wherein the values of the coefficient data are determined through a model training process.

13. The processor of claim 11, wherein the function type is selected from at least one of a polynomial function, a bimodal distribution function, a Gaussian distribution function, or a Poisson distribution function.

14. The processor of claim 11, wherein the coefficient data was compressed using arithmetic coding or Huffman coding.

15. The processor of claim 11, wherein the decompression circuit is configured to decompress the compressed coefficient data by applying the set of function parameters to at least a portion of the compressed coefficient data corresponding to a first compressed coefficient to determine a first decompressed coefficient value.

16. The processor of claim 15, wherein the decompression circuit is configured to apply the set of function parameters to at least a portion of the compressed coefficient data corresponding to a first compressed coefficient to determine a first decompressed coefficient value by:
   receiving a sequence of one or more bits of the first compressed coefficient;
   generating first and second extended bit sequences based upon the received sequence of bits;
   applying the set of function parameters to the first and second extended bit sequences to determine first and second respective coefficient values; and
   in response to a determination that the first and second coefficient values are the same, outputting the first coefficient value as the first decompressed coefficient value.

17. The processor of claim 11, wherein:
   the coefficient data comprises a first subset of coefficients compressed using the compression function, and a second subset of coefficients compressed using a second compression function, and
   the set of function parameters comprises a first set of function parameters corresponding to the compression function, and a second set of function parameters corresponding to the second compression function, and
   wherein the decompression circuit is configured to receive the set of function parameters by receiving the first set of function parameters or the second set of function parameters based upon a subset of coefficients to be decompressed.

18. The processor of claim 11, wherein the decompression circuit is configured based upon the set of function parameters by selecting a decompression function circuit based upon the function type specified by the set of function parameters.

19. The processor of claim 10, wherein the first decompression function and the second decompression function are selected from at least one of a polynomial function, a bimodal distribution function, a Gaussian distribution function, or a Poisson distribution function.

20. The processor of claim 10, wherein the compressed coefficients are compressed using arithmetic coding or Huffman coding.

21. The processor of claim 10, wherein the first decompression circuit is configured to decompress the first compressed coefficients by applying the first decompression function to at least a portion of the compressed coefficient data corresponding to a first coefficient of the first compressed coefficients to determine a first decompressed coefficient value.

22. The processor of claim 21, wherein the first decompression circuit is configured to apply the first decompression function to at least a portion of the compressed coefficient data corresponding to a first coefficient of the first compressed coefficients to determine a first decompressed coefficient value by:
   receiving a sequence of one or more bits of the first coefficient;
   generating first and second extended bit sequences based upon the received sequence of bits;
   applying the first decompression function to the first and second extended bit sequences to determine first and second respective coefficient values; and
   in response to a determination that the first and second coefficient values are the same, outputting the first coefficient value as the first decompressed coefficient value.

* * * * *